Feb. 12, 1974 A. M. FERRARA ET AL 3,791,939

METHOD OF SELECTIVELY DEPOSITING A METAL ON A SURFACE

Filed May 15, 1972

3,791,939

METHOD OF SELECTIVELY DEPOSITING A METAL ON A SURFACE

Anne Marie Ferrara, Princeton Township, Mercer County, and John Thomas Kenney, Lawrence Township, Mercer County, N.J., assignors to Western Electric Company, Incorporated, New York, N.Y.

Filed May 15, 1972, Ser. No. 252,995
Int. Cl. C23b *5/64*; C23c *3/02*
U.S. Cl. 204—15 12 Claims

ABSTRACT OF THE DISCLOSURE

A method of depositing a metal pattern on a surface of a substrate is disclosed. A surface of the substrate is sensitized with a photosensitive sensitizer selected from the group of sensitizers comprising a photosensitive gold sensitizer and a photosensitive platinum sensitizer. The sensitized surface is exposed to a source of ultraviolet radiation to delineate an unexposed pattern corresponding to the desired metal pattern. The selectively ultraviolet radiation-exposed surface is then immersed in a suitable electroless metal deposition solution wherein an electroless metal is catalytically reduced on the delineated unexposed pattern.

BACKGROUND OF THE INVENTION

(1) Field of the invention

This invention relates to a method of depositing a metal pattern on a surface and more particularly, to a photographic-like method of depositing a metal pattern on an insulative surface utilizing a sensitizer selected from the group comprising a photosensitive gold sensitizer and a photosensitive platinum sensitizer.

(2) Description of the prior art

The frequency of use of so-called circuit boards has in recent times increased greatly. The advantages of such boards need not be enumerated, because they are well known. Various methods for producing metallic patterns on substrates to produce the circuit boards are similarly well known. These methods include, alone or in various combinations, positive and negative printing processes, positive and negative silk-screening processes, positive and negative etching techniques, electroplating and electroless plating.

Electroless plating has found great favor with many workers in the art and has, in fact, been known in at least rudimentary form since before 1845 (see Symposium on Electroless Nickel Plating, published by the American Society for Testing Materials as ASTM Special Technical Publication, No. 265 in November of 1959).

Generally speaking, electroless plating requires a so-called catalyzation step during which a substrate surface to be electrolessly plated with a metal has placed thereon a material, usually a metal salt. This metal salt is capable of reducing the plated metal from an electroless bath without the use of an electrical current. Catalyzation by such a material (called a "catalyst" or "sensitizer") is referred to as such because the materials used, usually the salts of the precious metals (palladium, platinum, gold, silver, iridium, osmium, ruthenium, and rhodium) serve as reduction catalysts in the autocatalytic electroless plating process. Often, catalyzation is characterized as providing "nucleating sites" onto which the plated metal is "brought down" by a chemical reduction, or more generally, by a redox reaction. See, for example, U.S. Pats. 3,119,709 and 3,011,920.

Refinements of the basic electroless plating technique are necessary when the plated metal is electrolessly plated onto selected portions of a substrate surface in a pattern, rather than on the entire surface, to produce a circuit board. One such refinement is the novel additive, photoselective metal deposition process of M. A. De Angelo et al., U.S. 3,562,005.

In the novel De Angelo et al. additive process of metallic pattern generation, patterns are generated without etching or photoresist masking. Specifically, a solution, called a "photopromoter" which has (or at least a part of which has) the ability to be retained on a substrate is applied to the substrate. The "photopromoters" revealed in De Angelo et al. are solutions comprising either Sn, Ti, Pb, Fe, or Hg ions. The retained photopromoter (Sn, Ti, Pb, Fe, or Hg ion containing) has a photopromoter species, i.e., the respective metal ion, which is capable of changing oxidation state upon exposure thereof to appropriate radiation. In one oxidation state (but not both) the photopromoter species is able to reduce, from a salt solution thereof, a precious metal (there defined as palladium, platinum, gold, silver, osmium, indium, iridium, rhenium, rhodium). The precious metal initiates an autocatalytic plating process.

After the substrate retains some of the photopromoter, it is selectively exposed to the appropriate radiation, specifically ultraviolet radiation of short wavelength and below 3,000 A. This exposure renders some portions of the substrate able to reduce the precious metal and rendering other portions not so capable. Subsequently, electroless metal is deposited only where it is desired, i.e., on the reduced precious metal.

Some potential photopromoters do not exhibit "practical wetting" of desirable substrates. "Practical wetting" is defined as the ability of a surface to retain, on a substantially macroscopically smooth, unroughened portion thereof, a continuous, thin, uniform layer of a liquid, such as water or other liquid medium, when the surface is held vertically, or in any other orientation. To eliminate this problem, the novel De Angelo et al. additive process of metallic pattern generation may be employed with the novel method of an application of J. T. Kenney, Ser. No. 8,022 now U.S. Pat. No. 3,657,003, filed Feb. 2, 1970, and assigned to the assignee hereof. The Kenney application discloses methods of rendering a non-wettable surface wettable, so that all the De Angelo et al. photopromoters can be used therewith.

The revelations of De Angelo et al. and Kenney have led to research in an effort to discover a composition which is both photosensitive and capable of wetting a hydrophobic surface, e.g., a plastic surface. One such composition has been discovered and comprises an aqueous solution which (1) comprises a Au containing species which is photosensitive and can be photopatterned for an ultimate deposition of metallic Au, and (2) is capable of wetting the hydrophobic surface. Another such composition comprises an aqueous solution which (1) comprises a Pt containing species which is photosensitive and can be photopatterned for an ultimate deposition of metallic Pt, and (2) is capable of wetting the hydrophobic surface.

SUMMARY OF THE INVENTION

This invention relates to a method of depositing a metal pattern on a surface and more particularly, to a photographic method of depositing a metal pattern on an insulative surface utilizing a photosensitive sensitizer selected from the group comprising a photosensitive gold sensitizer and a photosensitive platinum sensitizer.

A surface of a suitable substrate is sensitized with a photosensitive sensitizer or catalyst selected from the group of sensitizers comprising a photosensitive gold sensitizer and a photosensitive platinum sensitizer. A photosensitive gold sensitizer or a photosensitive platinum sensitizer comprises an ionic gold species or an ionic platinum species, respectively, which in its initial state is capable of participating in an electroless metal deposition catalysis, by subsequently forming catalytic gold metal or catalytic platinum metal, respectively, but which upon exposure to a source of ultraviolet radiation is rendered incapable of participating in an electroless metal deposition catalysis. The sensitized surface is selectively exposed to a suitable source of ultraviolet radiation to delineate an unexposed surface pattern corresponding to a desired electroless metal pattern. The selectively ultraviolet radiation-exposed surface is then exposed to a suitable electroless metal deposition solution, comprising a suitable reducing agent, e.g., $$\mathrm{H\overset{\displaystyle O}{\overset{\|}{C}}{-}H}$$

and metal ions destined to be reduced, e.g., $Cu^{+2}$, to catalytically reduce an electroless metal e.g., Cu, on the delineated pattern. The electroless metal-deposited pattern may be further built up by a conventional electrodeposition and the resultant metal deposit may be used as a circuit pattern of a circuit board.

DESCRIPTION OF THE DRAWING

The present invention will be more readily understood by reference to the following drawing taken in conjunction with the detailed description, wherein.

DETAILED DESCRIPTION

The present invention has been discussed primarily in terms of depositing Au, Pt and Cu on a surface of an insulative substrate. It will be readily appreciated that the inventive concept is equally applicable to depositing other suitable metals, which are catalytically reduced from their respective ions by catalytic gold metal or catalytic platinum metal.

Figure 1:
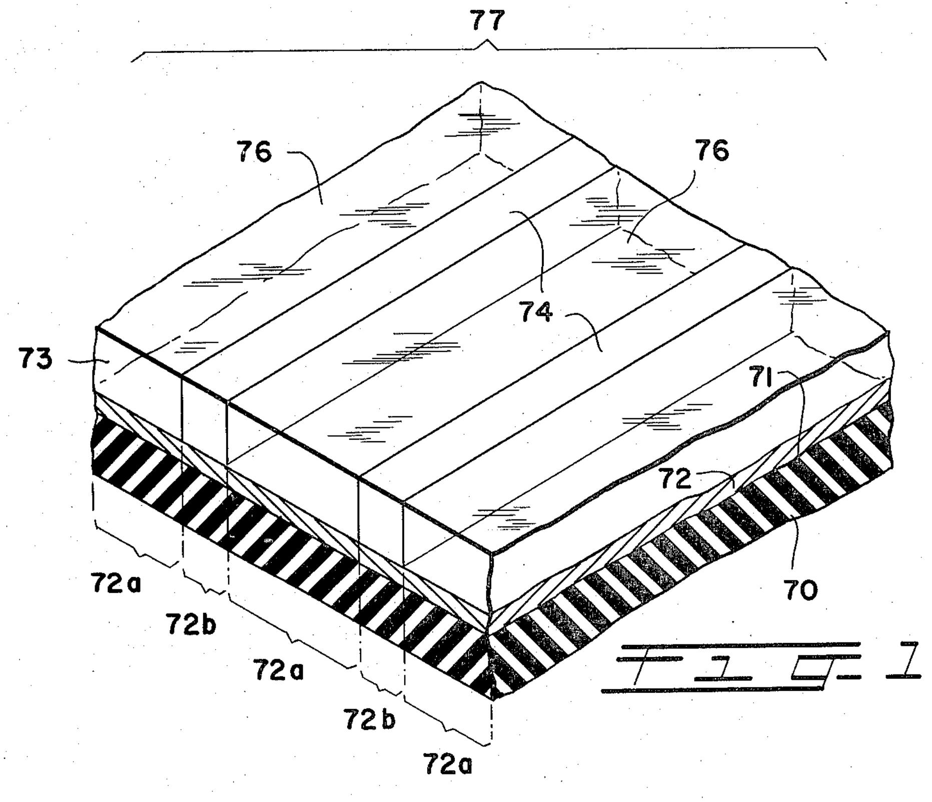
FIG. 1 is a partial isometric view of a portion of a typical substrate having a surface coated with a photosensitive sensitizer layer of the present invention.

Referring to FIG. 1, there is shown a portion of a suitable substrate 70. For the production of electrical circuit patterns, suitable substrates are those which are generally nonconductive. In general, all dielectric materials are suitable substrates. The substrate 70 is sensitized by applying a suitable photosensitive sensitizer or catalyst, selected from the group of sensitizers or catalysts comprising a photosensitive gold sensitizer and a photosensitive platinum sensitizer, to a surface 71 of the substrate to form a photosensitive sensitizer layer or coat 72.

Sensitization, as defined herein, is a process of depositing either a gold or platinum species on the surface 71 which is capable of participating in an electroless deposition catalysis, either by initially existing as catalytic gold metal [$Au^0$] or catalytic platinum metal [$Pt^0$], respectively, or by subsequently being converted into or forming catalytic gold or catalytic platinum, respectively. By catalytic gold metal or catalytic platinum metal is meant gold metal or platinum metal which serves as a reduction catalyst in an autocatalytic plating process.

A gold sensitizer or a platinum sensitizer, as defined herein, comprises either the gold or platinum sensitizing species, respectively, which can initially exist (1) as a catalytic atomic species, i.e., as catalytic gold metal [$Au^0$] or platinum metal [$Pt^0$]; or (2) as a catalytic ionic species, e.g., $Au^{+1}$ ions, $Pt^{+2}$ ions, which is subsequently converted into catalytic gold metal or platinum metal, respectively, as by reduction with a suitable reducing agent, e.g., $Sn^{+2}$, $$\mathrm{H\overset{\displaystyle O}{\overset{\|}{C}}{-}H}$$

hydrazine, etc.; or (3) as both a catalytic atomic species and a catalytic ionic species. A photosensitive gold or platinum sensitizer is defined herein as comprising a gold or platinum sensitizing species, respectively, which in its initial state is capable of participating in an electroless metal deposition catalysis, i.e., is capable of acting as either a gold or platinum sensitizer, but which upon exposure to a suitable source of ultraviolet radiation is rendered incapable of participating in an electroless metal deposition catalysis.

Suitable photosensitive gold sensitizers have been found to be colloidal gold species containing solutions, where the gold species exists as ionic gold (associated, e.g., as insoluble particles of a hydrous oxide of gold, or dissociated, e.g., as ionized gold ions such as $Au^{+1}$, or as a mixture of both). Some typical gold solutions, which act as photosensitive gold sensitizers, are colloidal gold solutions comprising an insoluble aurous hydrous oxide. Such solutions are formed by a controlled hydrolysis and nucleation reaction in an aqueous medium wherein colloidal particles of the colloidal solution (1) have a size within the range of 10 A. to 10,000 A. and (2) comprise the insoluble hydrous oxide of gold ($Au^{+1}$). The term hydrous oxide is as defined in Kenney, Ser. No. 8,022, now U.S. Pat. No. 3,657,003, assigned to the assignee hereof and incorporated by reference herein, namely as an insoluble oxide, an insoluble hydroxide, an insoluble oxide-hydroxide or an insoluble mixture of an oxide and a hydroxide (including all permutations and combinations of the oxides and/or hydroxides revealed in Kenney). The hydrolysis reaction includes dissolving a salt of gold in the aqueous medium and maintaining the pH of the aqueous medium at a point where no flocculate results.

Generally, these photosensitive gold colloidal sensitizer solutions are prepared in the same way as other hydrous oxide wetting solutions, described in Kenney, are prepared. Specifically, an aurous salt, e.g., AuCl, is selected and dissolved in an aqueous medium. Prior to such dissolution, the pH and/or temperature of the aqueous medium are adjusted, if necessary, so that when the salt is dissolved therein, no precipitate or flocculate results. The salt is then dissolved therein. The pH and/or temperature of the resultant solution are now adjusted, again if necessary, a hydrolysis and nucleation reaction being thereby permitted to occur at a given rate, for a given time, during which time insoluble colloidal particles of the hydrous oxide of gold are generated.

Suitable photosensitive platinum sensitizers have been found to be colloidal platinum species containing solutions, comprising ionic platinum species (associated, e.g., as insoluble particles of a hydrous oxide of platinum, or dissociated, e.g., as ionized platinum ions such as $Pt^{+2}$, or as a mixture of both). Specifically, suitable platinum solutions which act as photosensitive platinum sensitizers are colloidal platinum wetting solutions, which are generally described as stable colloidal solutions formed by a controlled hydrolysis and nucleation reaction in an aqueous medium wherein colloidal particles of the colloidal wetting solution (1) have a size within the range of 10 A. to 10,000 A. and (2) comprise an insoluble hydrous oxide of platinum. Again, the term "hydrous oxide" is as defined in Kenney, referred to above. The hydrolysis reaction includes dissolving a salt of platinum in the aqueous medium and maintaining the pH of the aqueous medium at a point where no flocculate results.

Generally, these photosensitive platinum colloidal sensitizer solutions are prepared in the same way as other hydrous oxide wetting solutions, described in Kenney, are prepared. In this regard, a platinum wetting solution, designated in Kenney as Example XIV, is a typical platinum sensitizer which is photosensitive. Specifically, a platinum salt, e.g., $PtCl_2$, is selected and dissolved in an aqueous medium. Prior to such dissolution, the pH and/or temperature of the aqueous medium are adjusted, if necessary, so that when the salt is dissolved therein, no precipitate or flocculate results. The salt is then dissolved therein. The pH and/or temperature of the resultant solution are now adjusted, again if necessary, whereby a hydrolysis and nucleation reaction is permitted to occur at a given rate, for a given time, during which time insoluble colloidal particles of the hydrous oxide of platinum are generated.

Ordinarily, the gold species or the platinum species (associated, e.g., a hydrous oxide of Au or Pt, dissociated, e.g., $Au^{+1}$ ions, $Pt^{+2}$ ions) contained in the respective gold or platinum colloidal sensitizer solutions is capable of participating in an electroless metal deposition catalysis. In other words, the species is capable of forming catalytic gold metal or catalytic platinum metal, respectively, as for example by being reduced thereto by a suitable reducing agent such as $Sn^{+2}$ ions or $$\mathrm{H\overset{\overset{O}{\|}}{C}-H}$$

Again, it is to be pointed out that by catalytic gold metal or catalytic platinum metal is meant metal which is capable of functioning as a reduction catalyst in an autocatalytic electroless process. Upon exposure, however, to a suitable source of ultraviolet radiation the gold or platinum species contained in the colloidal gold solution or the colloidal platinum solution, respectively, is no longer capable of participating in an electroless metal reduction catalysis. A suitable source of ultraviolet radiation being a source of ultraviolet radiation having a wavelength ranging from 1,800 A. to 2,900 A.

There is no explanation for the above phenomenon. It is not known what photoreaction takes place or what product (gold species, platinum species) is obtained by such a photoreaction. It is difficult to conceive what possible gold species or platinum species is obtained which cannot be reduced by a suitable reducing agent such as $$\mathrm{H\overset{\overset{O}{\|}}{C}-H}$$

(alone or combined in an electroless plating solution) to catalytic gold metal or platinum metal, respectively. However, the product obtained by exposure of either the photosensitive gold sensitizer or the photosensitive platinum sensitizer is one which is not reduced by a reducing agent, such as $$\mathrm{H\overset{\overset{O}{\|}}{C}-H}$$

(alone or combined in an electroless plating solution), to catalytic gold metal or catalytic platinum metal, respectively. The photoreaction product (gold species, platinum species) is not capable of participating in any fashion in the catalytic reduction of an electroless metal ion.

It is to be pointed out and stressed at this point that it is critical that the gold and the platinum sensitizers exist in a colloidal state, if such is not the case, then the gold and/or the platinum sensitizers cannot function photochemically, i.e., they are not photosensitive in the manner described above. It is also to be pointed out and stressed that the colloidal gold and platinum sensitizers are very long lived, i.e., the colloid gold and platinum sensitizers retain their photosensitivity for a relatively long period of time, typically, from several weeks to months.

Referring again to FIG. 1, a suitable mask 73 is placed contiguous to the photosensitive sensitizer layer 72. The mask 73 is a positive mask, i.e., has areas 74 which are opaque to a desired radiation to which the positive mask 73, and, ultimately, layer 72 is destined to be exposed, which areas correspond to a desired electroless metal-deposited pattern. The positive mask 73 has areas 76 which are capable of transmitting therethrough the desired radiation to which the positive mask 73 and layer 72 is destined to be exposed. It should be noted that in the alternative, separate masking areas may be applied to layer 72, utilizing standard materials and techniques known in the art.

A radiation source 77, e.g., an ultraviolet radiation source having a wavelength ranging from 1,800 A. to 2,900 A., is placed above the mask 73 and directed thereat. A plurality of rays having a wavelength ranging from 1,800 A. to 2,900 A. passes through or is transmitted through areas 76 of the mask 73 to expose areas **72*a* of the photosensitive sensitizer (Au, Pt) layer 72 thereto. The thus exposed areas 72*a* of the sensitizer layer 72, underlying and corresponding to areas 76 of the positive mask 73, are incapable of participating in a catalytic reduction of electroless metal ions to which the radiation exposed substrate 70 is destined to be exposed. In other words, a first gold or platinum species (ionic), capable of being reduced to catalytic gold or platinum, respectively, contained on areas 76 is transformed into a second gold species (ionic and/or atomic) or platinum species (ionic and/or atomic), respectively, which is incapable of being reduced to catalytic gold or platinum metal. What the respective second species are cannot be determined at this point in time. The remaining areas 72*b* of the sensitizer layer 72 (Au, Pt), corresponding to areas 74 of the positive mask 73, which have not been exposed, comprise thereon either the first gold or the first platinum species which retains or possesses the ability to participate in an electroless metal deposition catalysis to which the substrate 70** is destined to be exposed. A sensitizer pattern or outline delineated by ultraviolet radiation exposure, which is capable of participating in the catalytic reduction of an electroless metal from a suitable electroless plating solution, is thus established.

It is to be pointed out at this point, that the surface 71 is exposed to the ultraviolet radiation source 77 for a period of time sufficient to render areas 76 incapable of participating in an electroless metal deposition catalysis (whereby the catalytic gold metal or platinum metal, respectively, which renders such catalysis forms). Such a period of time is readily ascertained experimentally by one skilled in the art for a particular ultraviolet radiation source. It is to be noted, however, that the time of exposure is interdependent upon the intensity of the source 77, i.e., upon the amount of energy transmitted by the source 77 to the surface 71. This interdependency is well known in the art or is easily ascertained by one skilled therein. The amount of energy supplied to the substrate surface 71 by the source 77, however, is not found to be critical and a typical exposure may range from 17 to 60 minutes at an intensity ranging from $0.2\mu$ watts/cm.$^2$ to $30\mu$ watts/cm.$^2$ (at wavelengths ranging from 2000 A. to 2900 A.

Figure 2:
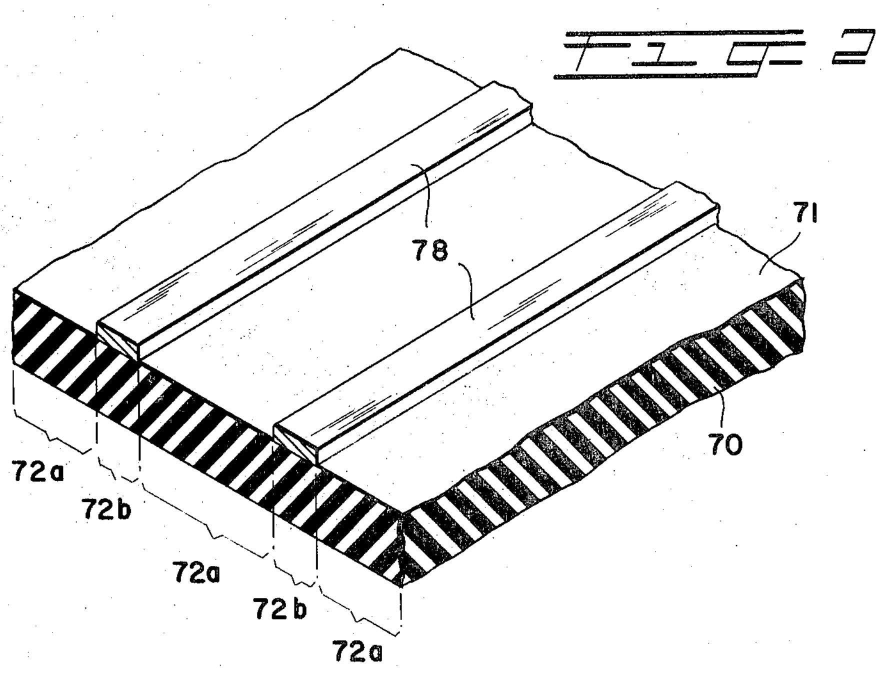
FIG. 2 is a partial isometric view of the portion of the substrate of FIG. 1 after a metallic pattern has been photoselectively deposited thereon by the novel method of the present invention.

The radiation exposed substrate 70 is immersed in a suitable electroless metal deposition solution wherein, sequentially, (1) catalytic gold metal or catalytic platinum metal, respectively, is formed on areas **72*b* and (2) an electroless metal ion, e.g., $Cu^{+2}$, is reduced to the metal, e.g., Cu, and deposited on areas 72*b* of the substrate 70 to form an electroless metal deposit 78** (as shown in FIG. 2). A suitable electroless metal deposition solution comprises a suitable reducing agent, e.g., $$\mathrm{H\overset{\overset{O}{\|}}{C}-H}$$

and a metal ion, e.g., $Cu^{+2}$, which is catalytically reduced to its corresponding metal, e.g., Cu, by the suitable reducing agent, e.g., $$\mathrm{H\overset{\overset{O}{\|}}{C}-H}$$

in the presence of catalytic Au metal or Pt metal. A suitable reducing agent is one which (1) is capable of reducing gold or platinum ions (unexposed to ultraviolet radiation) to catalytic gold metal or platinum metal, respectively, and (2) is capable of reducing the electroless metal ions to the corresponding electroless metal. The electroless metal deposition 78 may then be further built up or electroplated in a standard electroplating bath.

It is to be noted that the various typical electroless and electroplating solutions, plating conditions and procedures are well known in the art and will not be elaborated herein. Reference in this regard is made to Metallic Coating of Plastic, William Goldie, Electrochemical Publications, 1968.

It is also to be noted, that the invention disclosed herein may be employed in the production of electrical circuit paterns on a nonconductive substrate, in a similar fashion to that revealed in U.S. 3,562,005, assigned to the assignee hereof and incorporated by reference herein. In this regard, referring back to FIG. 1, areas 72*b* of the sensitizer layer 72 (Au, Pt) constitute a portion of a pattern conforming to a desired electrical circuit pattern. Referring to FIG. 2, the electroless deposit 78 obtained constitutes a portion of the electrical circuit pattern. The resulting electrical circuit pattern, represented by deposit 78 may be electroplated to a desired thickness whereafter the desired circuit pattern may be removed from the substrate 70 by appropriate means known in the art.

EXAMPLE I (A) A colloidal gold photosensitive sensitizer was prepared by dissolving 0.5 to 5 weight percent of AuCl in 0.1 N HCl (aqueous). The pH of the resultant solution was raised to between 4.5 and 6.0 by adding 0.5 N NaOH thereto, whereby a slightly cloudy yellow colloidal solution resulted.

A 2 mil thick polyimide substrate, commercially obtained, was cleaned by immersion in methanol. The substrate was then immersed in the colloidal gold sensitizer for one minute, followed by a 30-second rinse in flowing, deionized water. The substrate was then selectively exposed for about 17 minutes to a low-pressure mercury discharge lamp ($0.2\mu$ watt/cm.$^2$ intensity, $\lambda=2{,}540$ A., total energy of $200\mu$ joules/cm.$^2$) through a positive quartz mask. The mask had opaque areas through which the ultraviolet radiation did not pass, such opaque areas corresponding to a desired electroless metal-deposited pattern. The substrate was then immersed in an electroless plating bath, comprising copper sulfate, formaldehyde, complexer and caustic, wherein an electroless copper pattern, corresponding to unexposed areas of the substrate and to the opaque areas of the mask, having a thickness of $10\mu$ inches was obtained.

Electron beam diffraction patterns of the gold sensitizer, both before and after ultraviolet radiation exposure, were taken utilizing a standard technique known in the art. The patterns taken of the gold sensitizer prior to ultraviolet exposure revealed rings corresponding to a hydrous gold oxide and gold metal. Also present were diffraction rings which could not be identified. The patterns, taken of the sensitizer after ultraviolet radiation exposure, revealed rings corresponding to a hydrous gold oxide and to gold metal. The unidentified rings were still present but were less intense. It is hypothesized that the gold metal results, in both instances, from the decomposition of the hydrous gold oxide caused by the vacuum employed in the diffraction study combined with the heat produced from the electron beam.

(B) The procedure of Example I(A) was repeated except that the pH of the resultant solution was not adjusted to 4.5–6.0 and a colloidal solution was not obtained. An electroless copper pattern was not obtained on the polyimide substrate, but rather blanket deposition thereof.

(C) The procedure of Example I(A) was repeated except that an incandescent miscrope light representing a radiation source having a wavelength of 3,200 A. was employed. After an exposure whereby a total energy of $200\mu$ joules/cm.$^2$ was transmitted to the substrate, through the quartz mask, an electroless copper pattern was not obtained on the substrate, but rather blanket deposition thereof. There was no electroless copper deposited on those areas of the substrate exposed to the source of ultraviolet radiation.

EXAMPLE II (A) A colloidal platinum photosensitive sensitizer was prepared by dissolving 0.2–4 weight percent of $PtCl_2$ in 0.1 N HCl. Equal part of N NaOH and 0.5 N $NH_4OH$ were added to the resultant solution to adjust the pH to about $5.5\pm1.0$ whereby a finely divided brown colloid solution formed. The substrate and procedure of Example I were employed except that the ultraviolet radiation exposure was for 25 minutes (total energy=$300\mu$ joules/cm.$^2$). A $10\mu$ inch electroless copper pattern was obtained on the polyimide substrate.

Electron beam diffraction patterns of the platinum sensitizer, both before and after ultraviolet radiation exposure, were taken utilizing a standard technique known in the art. The patterns, taken of the sensitizer prior to ultraviolet radiation exposure, revealed rings corresponding to a hydrous platinum oxide and platinum metal. Also present were diffraction rings which could not be identified. The patterns, taken of the platinum sensitizer after ultraviolet radiation exposure, revealed rings corresponding to a hydrous platinum oxide and to platinum metal. The unidentified rings were still present but were less intense. It is hypothesized that the platinum metal results, in both instances, from the decomposition of the hydrous platinum oxide caused by the vacuum employed in the diffraction study combined with the heat produced from the electron beam.

(B) The procedure of Example II(A) was repeated except that the pH of the resultant solution was not adjusted to about $5.5\pm1.0$ and a colloidal solution was not obtained. An electroless copper pattern was not obtained on the substrate, but rather blanket deposition thereof.

(C) The procedure of Example II(A) was repeated except that an incandescent microscope lamp representing a radiation source having a wavelength of 3,200 A. was employed. After an exposure whereby a total energy of $300\mu$ joules/cm.$^2$ was transmitted to the substrate through the quartz mask, an electroless copper pattern was not obtained on the substrate, but rather blanket deposition thereof.

(D) The procedure of Example II(A) was repeated except that the substrate was an epoxy substrate, commercially obtained. The platinum sensitizer was prepared in the following manner: One to 5 weight percent of potassium tetrachloro platinum (II) was dissolved in water. 0.5 N NaOH was added to the resultant solution to raise the pH from 6.5 to 7.5 whereby a brown colloidal solution formed. A $10\mu$ inch electroless copper pattern was obtained on the epoxy substrate.

Electron beam diffraction patterns of the platinum sensitizer were taken and yielded the same results as in Example II(A).

(E) The procedure of Example II(D) was repeated except that the pH of the resultant solution was not adjusted to 6.5–7.5 and a colloidal solution was not obtained. An electroless copper pattern was not obtained on the substrate, but rather blanket deposition thereof.

F. The procedure of Example II(D) was repeated except that an incandescent microscope lamp, representing a radiation source having a wavelength of 3,200 A. was employed. After an exposure whereby a total energy of $300\mu$ joules/cm.$^2$ was transmitted to the substrate through the quartz mask, an electroless copper pattern was not obtained on the substrate, but rather blanket deposition thereof.

(G) The procedure of Example II(A) was repeated except that the substrate was a polyester substrate, commercially obtained. The platinum sensitizer was the platinum wetting solution, revealed in Kenney, referred to above, and designated therein as Example XIV. Such solution was prepared by dissolving one weight percent of platinous dichloride [$PtCl_2$] in 100 ml. of hot (70° C.) dilute HCl. After cooling to room temperature the pH of this solution was raised to about 3 with a univalent alkali whereby a yellow colloidal solution was obtained. A 10$\mu$ inch electroless copper deposited pattern was obtained on the polyester substrate.

(H) The procedure of Example II(G) was repeated except that the pH of the resultant solution was not adjusted to about 3 and a colloidal solution was not obtained. An electroless copper pattern was not obtained on the substrate, but rather blanket deposition thereof.

(I) The procedure of Example II(G) was repeated except that an incandescent microscope lamp representing a radiation source having a wavelength of 3,200 A. was employed. After an exposure whereby a total energy of 300$\mu$ joules/cm.$^2$ was transmitted to the substrate through the quartz mask, an electroless copper pattern was not obtained on the substrate, but rather blanket deposition thereof.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method of depositing a metal pattern on a surface of a substrate, which comprises:

(a) sensitizing the surface with a photosensitive sensitizer selected from the group of sensitizers comprising a photosensitive colloidal gold solution comprising insoluble colloidal aurous hydrous oxide particles and a photosensitive colloidal platinum solution comprising insoluble colloidal platinum hydrous oxide particles;

(b) selectively exposing said sensitized surface to a source of ultraviolet radiation to delineate an unexposed pattern corresponding to the desired metal pattern; and (c) exposing said selectively exposed surface to a suitable electroless metal deposition solution to catalytically reduce an electroless metal on said delineated pattern.

2. In a method of selectively depositing a metal pattern on a surface of a substrate, which comprises:

(a) coating the surface with a colloidal solution comprising an inorganic species of an element selected from the group consisting of gold and platinum, said inorganic species upon exposure to a source of ultraviolet radiation being rendered incapable of participating in an electroless metal deposition catalysis; and (b) selectively exposing said coated surface to a source of ultraviolet radiation to delineate an unexposed coated surface pattern.

3. The method as defined in claim 2 which further comprises:

exposing said unexposed coated surface pattern to an electroless metal deposition solution to deposit an electroless metal thereon.

4. The methad as defined in claim 3 which further comprises:

electrochemically depositing a metal deposit on said electroless metal.

5. A method of selectively depositing a metal pattern on a surface of a substrate, which comprises:

(a) coating the surface with a stable aqueous colloidal solution, formed by a hydrolysis and nucleation reaction, comprising insoluble hydrous oxide particles of an element selected from the group consisting of gold and platinum, said particles having a size within the range of 10 A. to 10,000 A. and said hydrolysis reaction including at least (1) dissolution of a salt of said element in an aqueous medium and (2) maintenance of the pH of said aqueous medium at a point where no flocculate results;

(b) exposing selected portions of the surface to a source of ultraviolet radiation to render a species of said element contained on said selected portions incapable of being reduced to catalytic metal, said selected portions conforming to a negative of the pattern; and (c) immersing said selectively exposed surface in an electroless metal plating bath to sequentially (1) form catalytic metal and (2) reduce an electroless metal thereon, said reduction being catalyzed by said formed catalytic metal.

6. A method of rendering an inorganic ionic gold species contained on an insulating surface incapable of participating in an electroless metal deposition catalysis, which comprises:

exposing a colloidal solution comprising said species to a source of ultraviolet radiation.

7. A method of rendering an inorganic ionic species, capable of being reduced to catalytic gold, incapable of participating in an electroless metal catalysis, which comprises:

(a) preparing a stable aqueous colloidal solution, comprising the species, by:

(a$^1$) forming an aqueous solution of a gold salt, including the sub-steps of:

(1) adjusting the pH of an aqueous medium to a value which prevents formation of a spontaneous precipitate upon dissolution in said medium of said gold salt; and (2) dissolving said gold salt in said medium to produce a salt solution;

(b$^1$) producing a colloidal solution by forming a colloidal, solid phase in said salt solution, said colloidal, solid phase comprising insoluble hydrous oxide particles of gold, said particles having dimensions ranging from 10° A. to 10,000 A., including at least the sub-steps of:

(1) effecting a hydrolysis and nucleation reaction of said dissolved salt in said salt solution; and (2) maintaining the pH of said salt solution at a value which prevents a spontaneous precipitate; and (b) exposing said colloidal solution, contained on an insulating surface, to a source of ultraviolet radiation.

8. A method of rendering an inorganic ionic platinum species contained on an insulating surface incapable of participating in an electroless metal deposition catalysis, which comprises:

exposing a colloidal solution comprising said species to a source of ultraviolet radiation.

9. A method of rendering an inorganic species, capable of being reduced to catalytic platinum, incapable of participating in an electroless metal catalysis, which comprises:

(a) preparing a stable aqueous colloidal solution, comprising the species, by:

(a$^1$) forming an aqueous solution of a platinum salt, including the sub-steps of:

(1) adjusting the pH of an aqueous medium to a value which prevents formation of a spontaneous precipitate upon dissolution in said medium of said platinum salt; and (2) dissolving said platinum salt in said medium to produce a salt solution;

(b$^1$) producing a colloidal solution by forming a colloidal, solid phase in said salt solution, said colloidal, solid phase comprising insoluble hydrous oxide particles of platinum, said particles having dimensions ranging from 10 A. to 10,000 A., including at least the sub-steps of:

(1) effecting a hydrolysis and nucleation reaction of said dissolved salt in said salt solution; and (2) maintaining the pH of said salt solution at a value which prevents a spontaneous precipitate; and (b) exposing said colloidal solution contained on an insulating surface to a source of ultraviolet radiation.

10. A method of producing an electrical circuit pattern on a nonconductive substrate, which comprises:

(a) coating the substrate with a colloidal solution comprising a photosensitive inorganic species of an element selected from the group consisting of gold and platinum, which is initially capable of being reduced to a catalytic metal but which upon exposure to ultraviolet radiation is rendered incapable of such reduction;

(b) selectively exposing said coated substrate to a source of ultraviolet radiation to generate a surface pattern conforming to the electrical circuit pattern; and (c) immersing said selectively exposed substrate in an electroless plating bath, catalyzed by the catalytic metal, to deposit electroless metal on said surface pattern to produce the electrical circuit pattern.

11. The method as defined in claim 10 which comprises the additional step of electroplating metal onto said electrical circuit pattern.

12. The method as defined in claim 11 which comprises the additional step of removing the substrate from said electroplated circuit pattern.

References Cited

UNITED STATES PATENTS

| | | | |
|---|---|---|---|
| 3,672,938 | 6/1972 | Zeblisky | 117—130 E |
| 3,684,569 | 8/1972 | Milgram | 117—212 |
| 3,562,038 | 2/1971 | Shipley et al. | 117—213 |
| 3,529,961 | 9/1970 | Schaefer et al. | 117—212 |

RALPH S. KENDALL, Primary Examiner

J. W. MASSIE, Assistant Examiner

U.S. Cl. X.R.

117—47 A, 130 E, 201, 212, 213, 217; 204—29

UNITED STATES PATENT OFFICE
CERTIFICATE OF CORRECTION

Patent No. 3,791,939 Dated February 12, 1974

Inventor(s) A. M. Ferrara and J. T. Kenney

It is certified that error appears in the above-identified patent and that said Letters Patent are hereby corrected as shown below:

In the specification, column 7, line 9, "paterns" should read -- patterns --; line 69, "miscrope" should read -- microscope --.

In the claims, column 9, line 61, claim 4, "methad" should read -- method --. Column 10, line 37, claim 7, "10°A." should read -- 10 A. --.

Signed and sealed this 30th day of July 1974.

(SEAL)
Attest:

McCOY M. GIBSON, JR.
Attesting Officer

C. MARSHALL DANN
Commissioner of Patents